US007127222B2

United States Patent
Kim et al.

(10) Patent No.: US 7,127,222 B2
(45) Date of Patent: Oct. 24, 2006

(54) AUTOMATIC GAIN CONTROL ADJUSTMENT OF A RADIO RECEIVER

(75) Inventors: Hea Joung Kim, Los Angeles, CA (US); Paul Anthony Lettieri, Lake Forest, CA (US); Brima B. Ibrahim, Aliso Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 66 days.

(21) Appl. No.: 10/879,244

(22) Filed: Jun. 28, 2004

(65) Prior Publication Data
US 2004/0242174 A1 Dec. 2, 2004

Related U.S. Application Data

(63) Continuation-in-part of application No. 10/255,391, filed on Sep. 26, 2002.

(51) Int. Cl.
*H04B 1/16* (2006.01)
(52) U.S. Cl. ................ 455/232.1; 455/234.2; 375/345
(58) Field of Classification Search ........... 455/232.1, 455/234.1, 245.1, 234.2, 249.1, 250.1, 253.2; 375/345, 317
See application file for complete search history.

(56) References Cited

U.S. PATENT DOCUMENTS

| 5,129,098 | A  | * | 7/1992  | McGirr et al. ............... 455/69  |
| 6,324,387 | B1 | * | 11/2001 | Kamgar et al. .......... 455/234.1 |
| 6,597,898 | B1 | * | 7/2003  | Iwata et al. ............. 455/240.1 |
| 6,654,594 | B1 | * | 11/2003 | Hughes et al. .......... 455/245.1 |

* cited by examiner

*Primary Examiner*—Edward F. Urban
*Assistant Examiner*—Blane Jackson
(74) *Attorney, Agent, or Firm*—Garlick Harrison & Markison; Timothy W. Markison

(57) ABSTRACT

A method for adjusting automatic gain control of a radio receiver begins by determining power level of a radio frequency (RF) signal received by the radio receiver to produce a determined power level. The method then continues by comparing the determined power level with a plurality of power thresholds to determine whether an automatic gain adjustment is needed. The method then continues, when the automatic gain adjustment is needed, by determining, from the comparing the determined power level with the plurality of power thresholds, a sign of the automatic gain adjustment. The method continues by determining, from the comparing the determined power level with the plurality of power thresholds, a magnitude of the automatic gain adjustment. The method continues by addressing a gain adjustment look up table for at least a portion of the radio receiver based on the magnitude to produce a gain setting. The method then continues by adjusting the automatic gain of the radio receiver based on the sign of the automatic gain adjustment and the gain setting.

21 Claims, 11 Drawing Sheets

AUTOMATIC GAIN CONTROL ADJUSTMENT OF A RADIO RECEIVER

This patent application is a continuation in part of co-pending patent application entitled ATTENUATION OF A RECEIVED RADIO FREQUENCY SIGNAL, having a filing Sep. 26, 2002 date of and a Ser. No. 10/255,391.

BACKGROUND OF THE INVENTION

1. Technical Field of the Invention

This invention relates generally to wireless communication systems and more particularly to radio receivers used within such systems.

2. Description of Related Art

Communication systems are known to, support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

As is also known, the receiver is coupled to the antenna and includes a low noise amplifier, programmable gain amplifier, one or more intermediate frequency stages, a filtering stage, automatic gain control, and a data recovery stage. The low noise amplifier receives inbound RF signals via the antenna and amplifies them. The programmable gain amplifier may further amplify the RF signals. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is further known, the signal strength of a received RF signal may vary dramatically (e.g., by 100 dB). The automatic gain control of the receiver functions to adjust the gain of the low noise amplifier, the programmable gain amplifier, and/or digital gain within the data recovery stage such that the receiver is sensitive enough to detect low power level signals and, once detected, to adjust the gain of these components to achieve nominal signal level. The automatic gain control also decreases the gain of the low noise amplifier, the programmable gain amplifier, and/or the digital gain of the data recovery stage when the received signal is a strong signal.

While such automatic gain control mechanisms work in many situations, there are some situations in which the automatic gain control does not adjust the gain of the low noise amplifier, the programmable gain amplifier, and/or the digital gain of the data recovery module. When this occurs, data is lost since the nominal signal level, which is expected for conversion to the digital domain, is not achieved.

Therefore, a need exists for a method and apparatus for automatic gain control of a radio receiver that overcomes the above mentioned limitations of existing automatic gain control circuits.

BRIEF SUMMARY OF THE INVENTION

The automatic gain control adjustment of a radio receiver of the present invention substantially meets these needs and others. In one embodiment, method for adjusting automatic gain control of a radio receiver begins by determining power level of a radio frequency (RF) signal received by the radio receiver to produce a determined power level. The method then continues by comparing the determined power level with a plurality of power thresholds to determine whether an automatic gain adjustment is needed. The method then continues, when the automatic gain adjustment is needed, by determining, from the comparing the determined power level with the plurality of power thresholds, a sign of the automatic gain adjustment. The method continues by determining, from the comparing the determined power level with the plurality of power thresholds, a magnitude of the automatic gain adjustment. The method continues by addressing a gain adjustment look up table for at least a portion of the radio receiver based on the magnitude to produce a gain setting. The method then continues by adjusting the automatic gain of the radio receiver based on the sign of the automatic gain adjustment and the gain setting.

In another embodiment, a method for adjusting automatic gain control of a radio receiver begins by determining power level of a radio frequency (RF) signal received by the radio receiver to produce a determined power level. The method continues by comparing the power level of the RF signal with an upper limit of a desired power level range. The method continues when the power level of the RF signal compares unfavorably with the upper limit of the desired power level range, decreasing gain of the radio receiver by decreasing digital baseband gain of the radio receiver until the power level of the RF signal compares favorably with the upper limit of the desired power level or the digital baseband gain reaches a minimum setting. The method continues when the digital baseband gain reaches the minimum setting by setting gain of a low noise amplifier of the radio receiver to a low level. The method continues when the power level of the RF signal compares unfavorably with the upper limit of the desired power level range with the gain of the low noise amplifier set at the low level and the digital baseband gain at the minimum setting by setting a transmit/receive switch in a receiver attenuation mode.

The method continues when the power level of the RF signal compares unfavorably with the upper limit of the desired power level range with the gain of the low noise amplifier set at the low level, the digital baseband gain at the minimum setting and the transmit/receiver switch in the receiver attenuation mode by reducing gain of a programmable gain amplifier of the radio receiver, via a look up table, until the power level of the RF signal compares favorably with the upper limit of the desired power level or the gain of the programmable gain amplifier reaches a minimum PGA setting. The method continues when the power level of the RF signal compares favorably with the upper limit of the desired power level range by comparing the power level of the RF signal with a lower limit of the desired power level range. The method continues when the power level of the RF signal compares unfavorably with the lower limit of the desired power level range, increasing gain of the radio receiver by setting the transmit/receive switch in a receiver non-attenuation mode.

The method continues when the power level of the RF signal compares unfavorably with the lower limit of the desired power level range with the transmit/receive switch in the receiver non-attenuation mode by setting the gain of the low noise amplifier to a high level. The method continues when the power level of the RF signal compares unfavorably with the lower limit of the desired power level range with the transmit/receive switch in the receiver non-attenuation mode and the gain of the low noise amplifier at the high level by incrementing the digital baseband gain until the power level of the RF signal compares favorably with the lower limit of the desired power level or the digital baseband gain reaches a maximum setting.

The method continues when the power level of the RF signal compares unfavorably with the lower limit of the desired power level range with the transmit/receive switch in the receiver non-attenuation mode, the gain of the low noise amplifier at the high level, and the digital baseband gain set at the maximum setting by increasing the gain of the programmable gain amplifier, via the look up table, until the power level of the RF signal compares favorably with the lower limit of the desired power level or the gain of the programmable gain amplifier reaches a maximum PGA setting. The method continues when the power level of the RF signal compares favorably to the upper limit and the lower limit of the desired power level range by balancing gains of the digital baseband gain and the programmable gain amplifier.

DETAILED DESCRIPTION OF THE INVENTION

Figure 1:
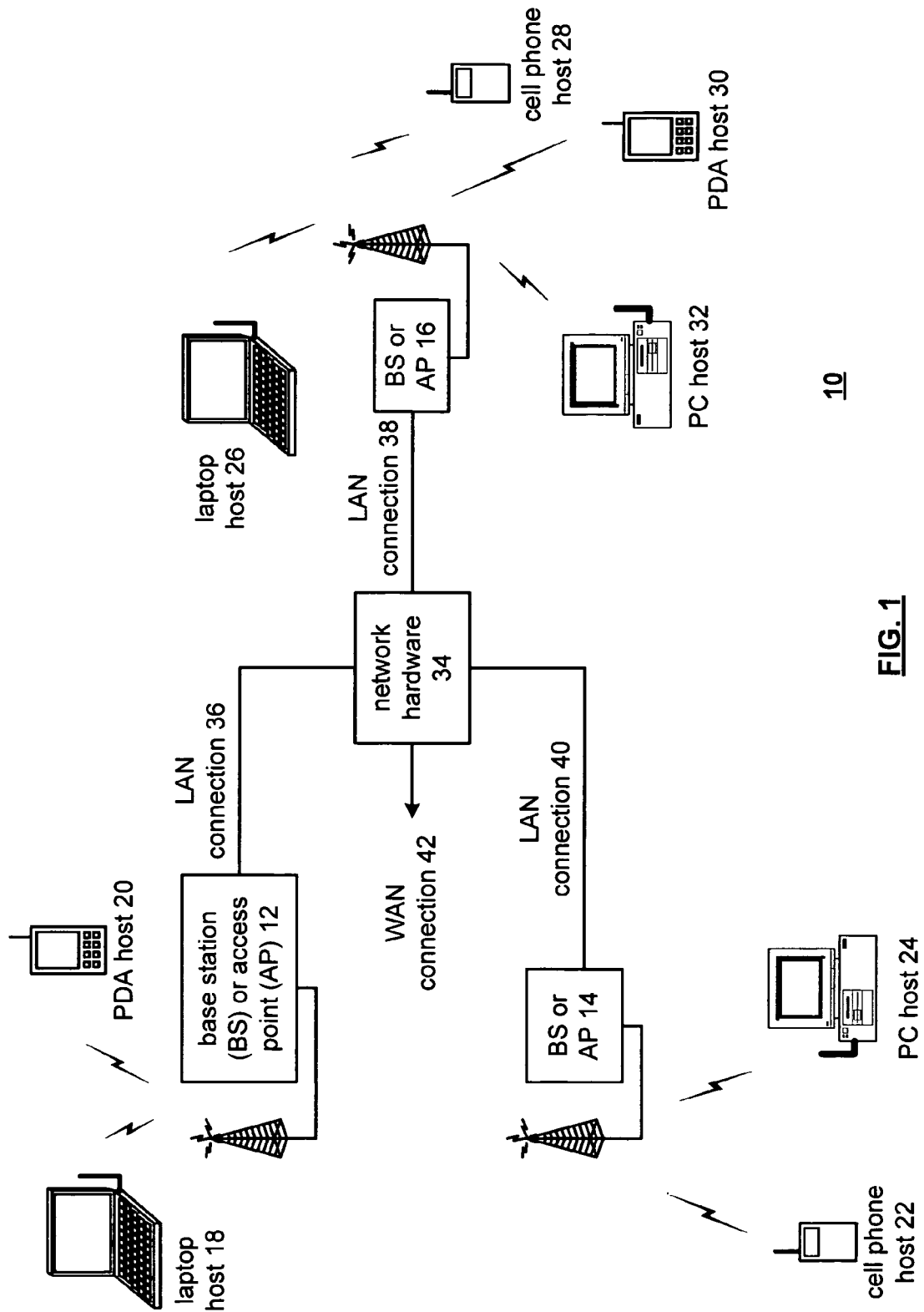
FIG. 1 is a schematic block diagram of a wireless communication system in accordance with the present invention.

FIG. 1 is a schematic block diagram illustrating a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12–16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base 30 stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
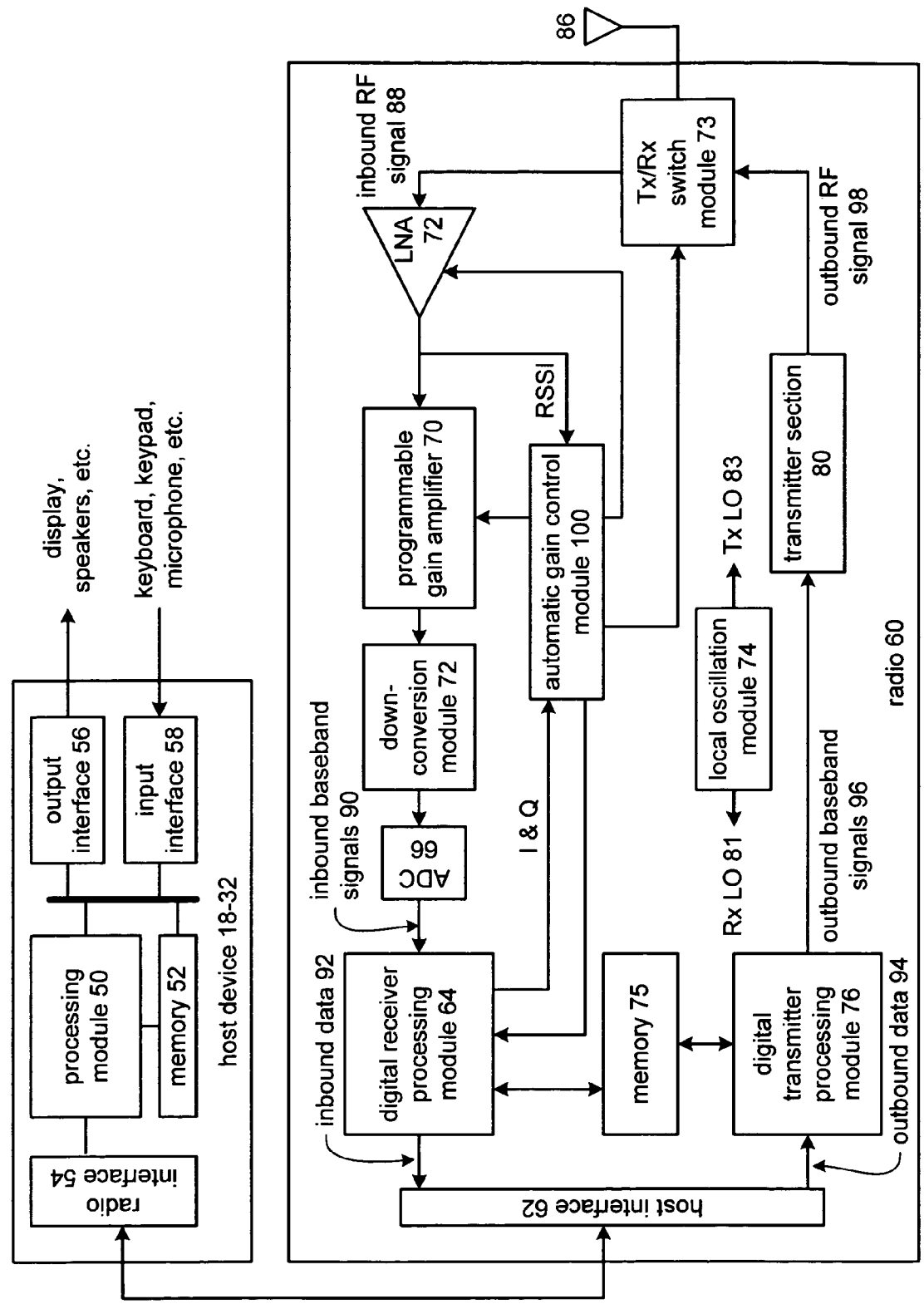
FIG. 2 is a schematic block diagram of a wireless communication device in accordance with the present invention.

FIG. 2 is a schematic block diagram illustrating a wireless communication device that includes the host device 18–32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18–32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a down conversion module 71, a programmable gain amplifier 70, a low noise amplifier 72, a transmitter/receiver switch 73, a local oscillation module 74, memory 75, a digital transmitter processing module 76, a transmitter section 80, and an antenna 86. The transmitter section 80 may include a digital-to-analog converter, a filtering/gain module, an IF mixing up conversion stage, a power amplifier 84, and a transmitter filter module. The antenna 86 may be a single antenna that is shared by the transmit and receive paths as regulated by the Tx/Rx switch 73, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11 Bluetooth, et cetera) to produce outbound baseband signals 96. The outbound baseband signals 96 will be digital base-band signals or digital low IF signals, where the low IF typically will be in the frequency range of one hundred kilohertz to a few megahertz.

The digital-to-analog converter of the transmitter section 80 converts the outbound baseband signals 96 from the digital domain to the analog domain. The filtering/gain module of the transmitter section 80 filters and/or adjusts the gain of the analog signal prior to providing it to the IF mixing stage of the transmitter section 80, which converts the analog baseband or low IF signals into RF signals based on a transmitter local oscillation 83 provided by local oscillation module 74. The power amplifier of the transmitter section 80 amplifies the RF signal to produce outbound RF signals 98, which are filtered by the transmitter filter module of the transmitter section 80. The antenna 86 transmits the outbound RF signal 98 to a targeted device such as a base station, an access point and/or another wireless communication device.

The radio 60 receives an inbound RF signal 88, which was transmitted by a base station, an access point, or another wireless communication device, via the antenna 86. The antenna 86 provides the inbound RF signal 88 to a receiver filter module (not shown) via the Tx/Rx switch 73, where the receiver filter module bandpass filters the inbound RF signal 88. The low noise amplifier 72 amplifies the inbound RF signals 88 in accordance with a gain setting provided by an automatic gain control (AGC) module 100 to produce an amplified inbound RF signal. The programmable gain amplifier 70 further amplifies the inbound RF signals 88 based on a gain setting provided by the AGC module 100. The down conversion module 71 directly converts the amplified inbound RF signal into an inbound low IF signal or baseband signal based on a receiver local oscillation 81 provided by local oscillation module 74.

The analog-to-digital converter 66 converts the down converted inbound signal from the analog domain to the digital domain to produce inbound baseband signals 90. The digital receiver processing module 64 decodes, descrambles, demaps, and/or demodulates the inbound baseband signals 90 to recapture inbound data 92 in accordance with the particular wireless communication standard being implemented by radio 60. The host interface 62 provides the recaptured inbound data 92 to the host device 18–32 via the radio interface 54.

The AGC module 100 functions to adjust the gain of the LNA 72, the gain of the programmable gain amplifier (PGA) 70, and/or digital gain with the digital receiver processing module 64 based on the signal strength of the inbound RF signals 88. The AGC module 100, which includes a look up table and as will be further described with reference to FIGS. 3–8, determines the signal strength of the inbound RF signals 88 by obtaining a received signal strength indication (RSSI) and/or by determining the power based on an in-phase (I) and quadrature (Q) components of the inbound baseband signals 90. From the power levels, the AGC module 100 balances the gain adjustments of the LNA 72, the PGA 70, and the digital gain of the digital processing module 64 such that the inbound signals are processed at nominal levels for accurate data recovery. Note that the AGC module 100 may be a processing device as referenced above with respect to the digital receiver and transmitter processing modules 64 and 76, or it may be included in one or more of the digital receiver and transmitter processing modules 64 and 76.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Figures 3A, 3B:
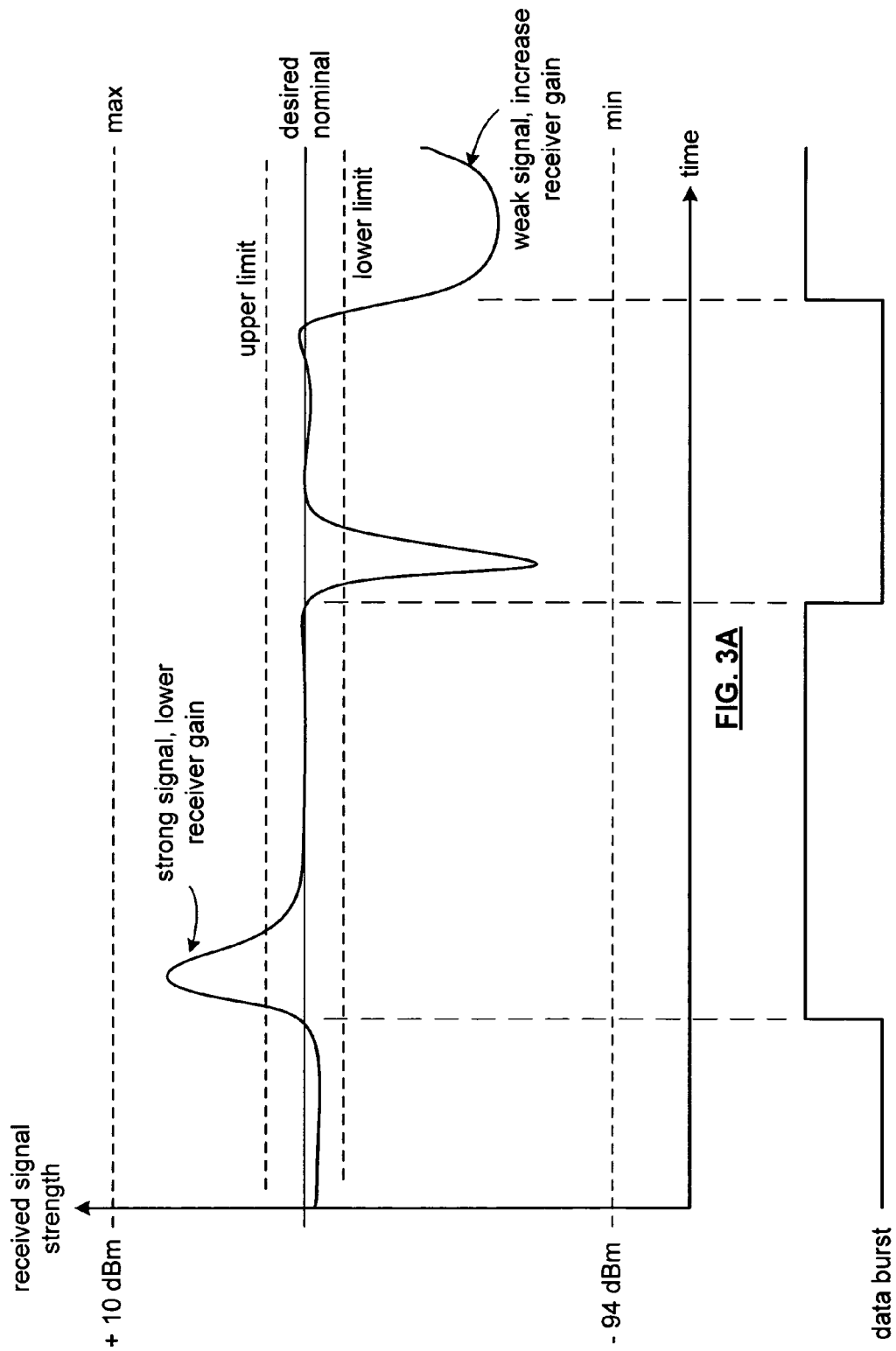
FIGS. 3A and 3B are a graphical illustration of automatic gain control in accordance with the present invention.

FIGS. 3A and 3B illustrate a relationship between the automatic gain control function of radio 60 and a received data burst. The data burst of FIG. 3B may correspond to packet transmissions within a wireless local area network. In such an instance, there is an absence of traffic as shown by the data burst being low and the presence of a packet on the wireless communication resource, which is indicated by the data burst being high.

The received signal strength of a RF signal may range from −94 dBm to +10 dBm, as shown in FIG. 3A. As such, the receiver must have a sensitivity range to accurately receive signals over such a wide power range. In the example of FIG. 3A, prior to the 1st data burst being received, the automatic gain control module 100 adjusts the gain of the low noise amplifier 72, programmable gain amplifier 70, the T/R switch, and/or the digital gain and the digital receiver processing module 64 such that the gain is at a nominal level. This nominal level may correspond to −6 dBm. When the data burst is received and the signal strength is strong, the automatic gain control module 100 lowers the gain of the low noise amplifier 72, programmable gain amplifier 70, T/R switch, and/or digital gain within the digital receiver processing module 64 such that the data burst is being processed at the desired nominal rate within upper and lower limits.

When the data burst ends, the signal strength goes to substantially zero such that the automatic gain control module 100 adjusts the gain of the low noise amplifier 72, programmable gain amplifier 70, the T/R switch, and/or digital gain within the digital receiver processing module 64 to again be at the desired nominal level.

When another data burst is received, it may have a weak signal strength which requires the receiver gain to be increased. As such, the automatic gain control module 100 increases the low noise amplifier gain 72, programmable gain amplifier 70 and/or the digital gain of the digital receiver processing module 64.

In a wireless LAN environment, the time to adjust the gain of the receiver in response to a data burst varies according to the standard to which the receiver is compliant. For example, with respect to IEEE 802.11a or g, the automatic gain control must be settled within 6 microseconds. To achieve this stringent requirement, the automatic gain control module 100 functions as described with reference to FIGS. 4 through 8.

Figure 4:
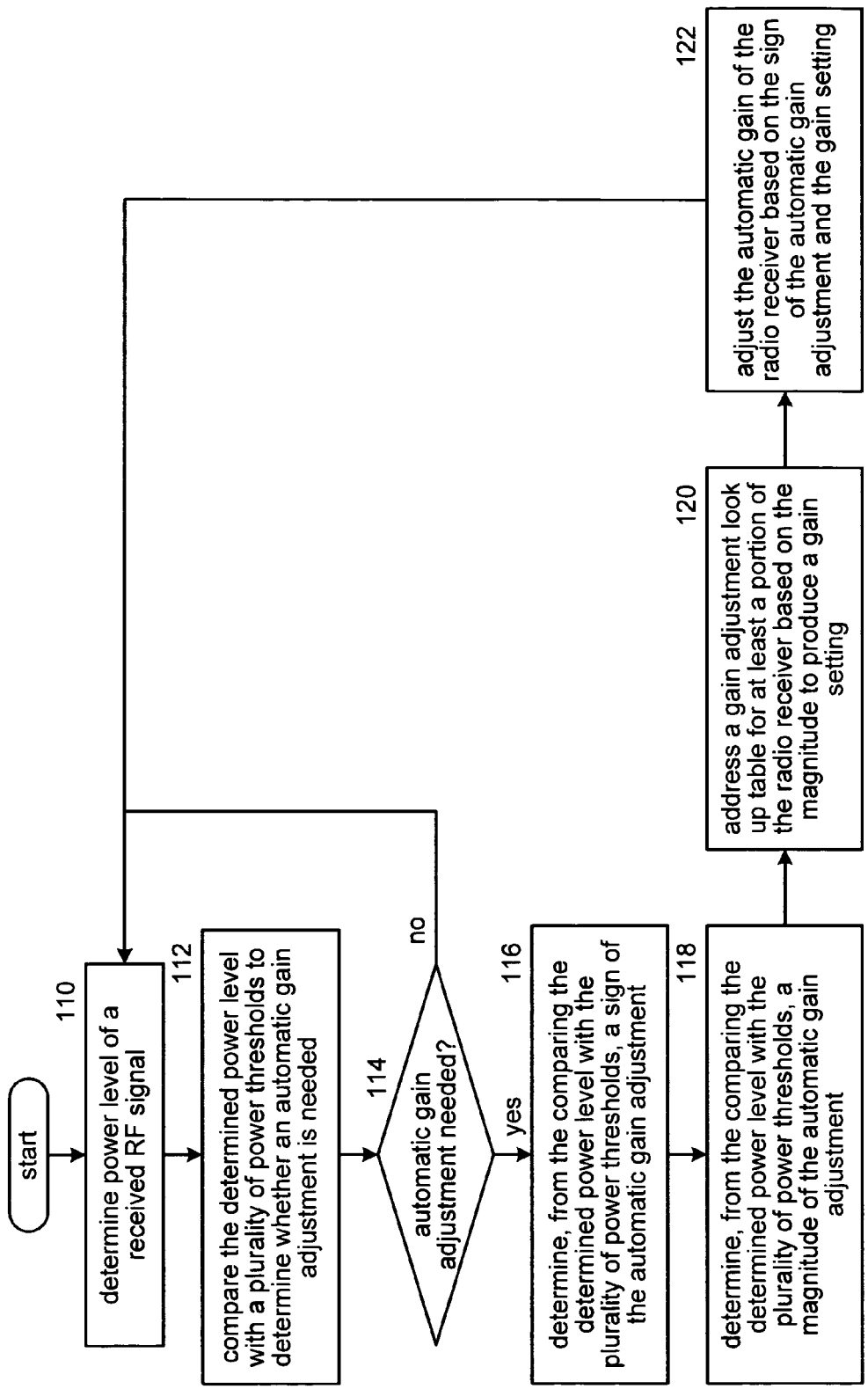
FIG. 4 is a logic diagram of a method for adjusting automatic gain control of a radio receiver in accordance with the present invention.

FIG. 4 is a logic diagram of a method for adjusting automatic gain control of a radio receiver. The method begins at Step 110 where power level of a received RF signal is determined. This may be done by measuring the power level of a received test RF signal during calibration of the radio receiver. The power level may be determined by measuring a received strength indication (RSSI) of the RF signal and/or by calculating the power of the RF signal based on a square of an in-phase baseband signal component plus a square of a quadrature baseband signal component.

The process then proceeds to Step 112 where the determined power level is compared with a plurality of power thresholds to determine whether an automatic gain adjustment is needed. The process then proceeds to Step 114 where the process branches based on whether an automatic gain control adjustment is needed. If not, the process reverts to Step 110 and repeats the power level measurement for another RF signal.

If an automatic gain control adjustment is needed, the process proceeds to Step 116 where a sign of the automatic gain control adjustment is determined by comparing the determined power level with the plurality of the power thresholds. In other words, at Step 116 a determination is made as to whether the gain of the receiver needs to be increased or decreased. The process then proceeds to Step 118 where a magnitude of the automatic gain adjustment is determined from the comparing of the determined power level with the plurality of thresholds. As such, from Steps 116 and 188 based on the power level threshold that is exceeded (or less than) the sign of the gain adjustment and the magnitude of the gain adjustment are determined.

The process then proceeds to Step 120 where a gain adjustment look-up table is addressed for at least a portion of the radio receiver (e.g., LNA, PGA, T/R switch, and/or digital gain) based on the magnitude to produce a gain setting. The process then proceeds to Step 122 where the automatic gain of the radio receiver is adjusted based on the sign of the automatic gain adjustment and the gain setting. Accordingly, the look-up table is used to determine the particular gain setting and whether the gain is to be increased or decreased by that amount is based on the corresponding sign as determined in Step 116.

FIGS. 5A–5D illustrate another method for adjusting automatic gain control of a radio receiver. The process begins at Step 124 where the power of a radio frequency signal is compared with a 1st power threshold of a plurality of power thresholds. The process then proceeds to Step 126 where a determination is made as to whether the power exceeded the 1st power threshold. If so, the process branches to Step 128 where a determination is made as to whether digital baseband gain is at least a 1st decrement step level above a minimum gain. For example, the digital baseband gain can range from zero to 20 dB, where the decrement gain steps may be at 6 dB increments, 4 dB increments or 2 dB increments. As such, the determination at Step 128 is determining whether the digital baseband gain is at least set at 4 dB, for a 4 dB decrement step level.

The process then proceeds to Step 130 where a determination is made as to whether the digital baseband gain is at least the 1st decrement step level above the minimum gain. If so, the process proceeds to Step 132 where the digital baseband gain is decremented by the 1st decrement step level. For example, if the 1st decrement step level is 4 dB, the digital baseband gain is decremented by 4 dB. Once this is done, the process reverts to Step 124. Note that the processing of the method shown in FIGS. 5A–5D may be repeated periodically, for example, at intervals of 500 nanoseconds.

If, at Step 126 the power of the received signal did not exceed the 1st power threshold, which may be 0 dBm, the process proceeds to Step 134 where the power of the received signal is compared with a 2nd power threshold of the plurality of thresholds, where the 1st power threshold is greater than the 2nd power threshold. For example, the 2nd power threshold may be −6 dBm.

The process then proceeds to Step 136 where a determination is made as to whether the power exceeds the 2nd power threshold. If so, the process proceeds to Step 138 where a determination is made as to whether the digital baseband gain is at least a 2nd decrement step level above the minimum gain. Further, Step 138 is reached when at Step 130 the digital baseband gain is not at least the 1st decrement step level above the minimum gain. For example, if the minimum gain is zero, the 1st decrement step level is 4 dB, and the 2nd decrement step level is 2 dB, then the determination of whether there is still digital baseband gain above the minimum gain can be determined.

The process then proceeds to Step 140 where a determination is made as to whether the digital baseband gain is at least the 2nd decrement step level above the minimum gain. If so, the process proceeds to Step 142 where the digital baseband gain is decremented by the 2nd decrement step level. The process then repeats at Step 124. Note that processing Steps 126–142 function to remove the digital baseband gain if the power level of the signal is above a desired 1st or 2nd threshold before gain is removed from the low noise amplifier and/or programmable gain amplifier.

If, at Step 136 the power does not exceed the 2nd power threshold, the process proceeds to Step 144 where the RSSI is compared with a 1st RSSI threshold of a plurality of thresholds. The process then proceeds to Step 136 where a determination is made as to whether the RSSI exceeds the 1st RSSI threshold. Note that the 1st RSSI threshold may be set at any range between the min and max levels illustrated in FIG. 3A but typically will be set at −10 dBm to 0 dBm. If the RSSI exceeds the 1st RSSI threshold, the process proceeds to Step 148 where a determination is made as to whether the low noise amplifier gain is set at a high level. Note that in one embodiment, the low noise amplifier has two gain settings a high level and a low level. As one of average skill in the art will appreciate, the low noise amplifier may have multiple gain settings that may be adjusted through this process.

If the low noise amplifier gain is set at the high level, the process proceeds to Step 150 where the low noise amplifier gain is adjusted to the low level. The process then repeats at Step 124. If, however, the low noise gain is not set at the high level or the RSSI does not exceed the 1st threshold, the process proceeds to Step 152 of FIG. 5B. At Step 152, the power of the received signal is compared with a 3rd power threshold of the plurality of power thresholds where the 2nd power threshold is greater than the 3rd power threshold. The process then proceeds to Step 154 where the transmit/receive switch mode is determined. The transmit/receive switch may be in a low attenuation receive mode or a high attenuation receive mode. Such adjusting of the transmit/receive switch mode is further described in co-pending patent application entitled ATTENUATION OF A RECEIVED RADIO FREQUENCY SIGNAL, having a filing date of Sep. 26, 2002 and a Ser. No. 10/255,391.

The process then proceeds to Step 156 where the programmable gain amplifier gain is compared with a 1st programmable gain amplifier gain setting. The process then proceeds to Step 158 where a determination is made as to whether the transmit/receive switch is in a non-attenuation mode, the low noise amplifier gain is at a low level and the PGA gain is above a 1st gain setting, and the power of the receive signal is greater than the 3rd threshold. When this is true, the process proceeds to Step 160 where the T/R switch is adjusted from the non-attenuation mode to the attenuation mode. Once this is done, the process reverts to Step 124. If, at Step 158 one of the tests is not true, the process proceeds to Step 162 where a determination is made as to whether the T/R switch is in attenuation mode, the PGA gain is above the 1st gain setting and the power is less than the 3rd threshold. When this is true, the process proceeds to Step 164 where the T/R switch is adjusted from the attenuation mode to the non-attenuation mode. The process then proceeds to Step 166 where the PGA gain is reduced using the look-up table-and a 1st adjust value. The 1st adjust value may indicate the particular steps at which the PGA gain is reduced. The process then reverts to Step 124.

If, however, at Step 162, one of the cases is not true, the process proceeds to Step 168 where the RSSI is compared with a 2nd RSSI threshold, which is less than the 1st RSSI threshold. The process then proceeds to Step 170 where the PGA gain is compared with a 2nd gain setting. Note that the PGA gain may be set at a plurality of levels where the 1st and 2nd PGA gain settings are within that plurality of settings.

The process then proceeds to Step 172 where a determination is made as to whether the LNA gain is at a low level, and the T/R switch is in an attenuation mode and the RSSI is greater than the 2nd threshold or the PGA gain is greater than the 2nd PGA setting. If this test is true, the process proceeds to Step 174 where the LNA gain is adjusted to the high level. The process then proceeds to Step 176 where the PGA gain is reduced using the look-up table and the 2nd adjust value. At this point, the process reverts to Step 124.

Figure 5A:
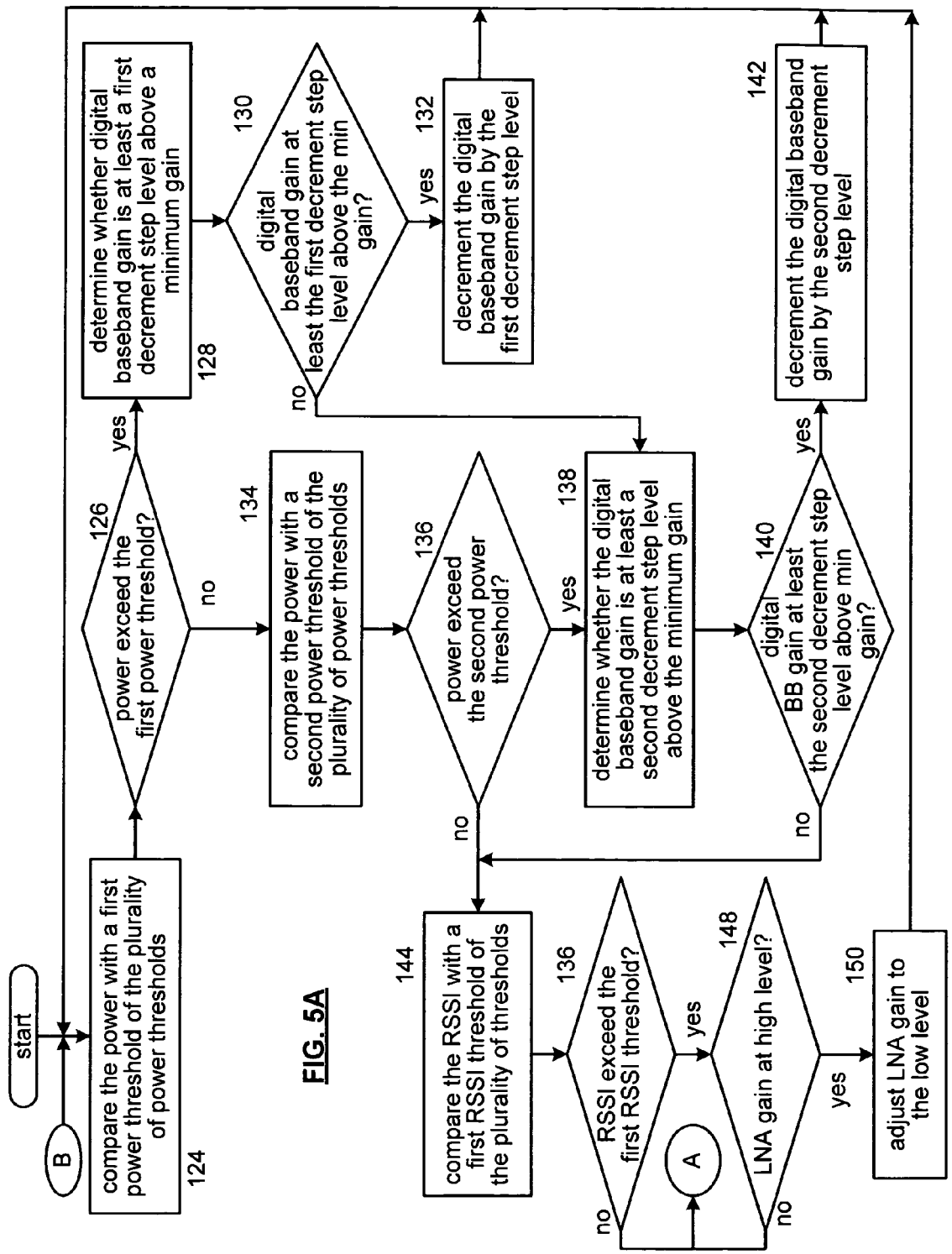
FIGS. 5A–5D are a logic diagram of an alternate method for adjusting automatic gain control of a radio receiver in accordance with the present invention.
Figure 5B:
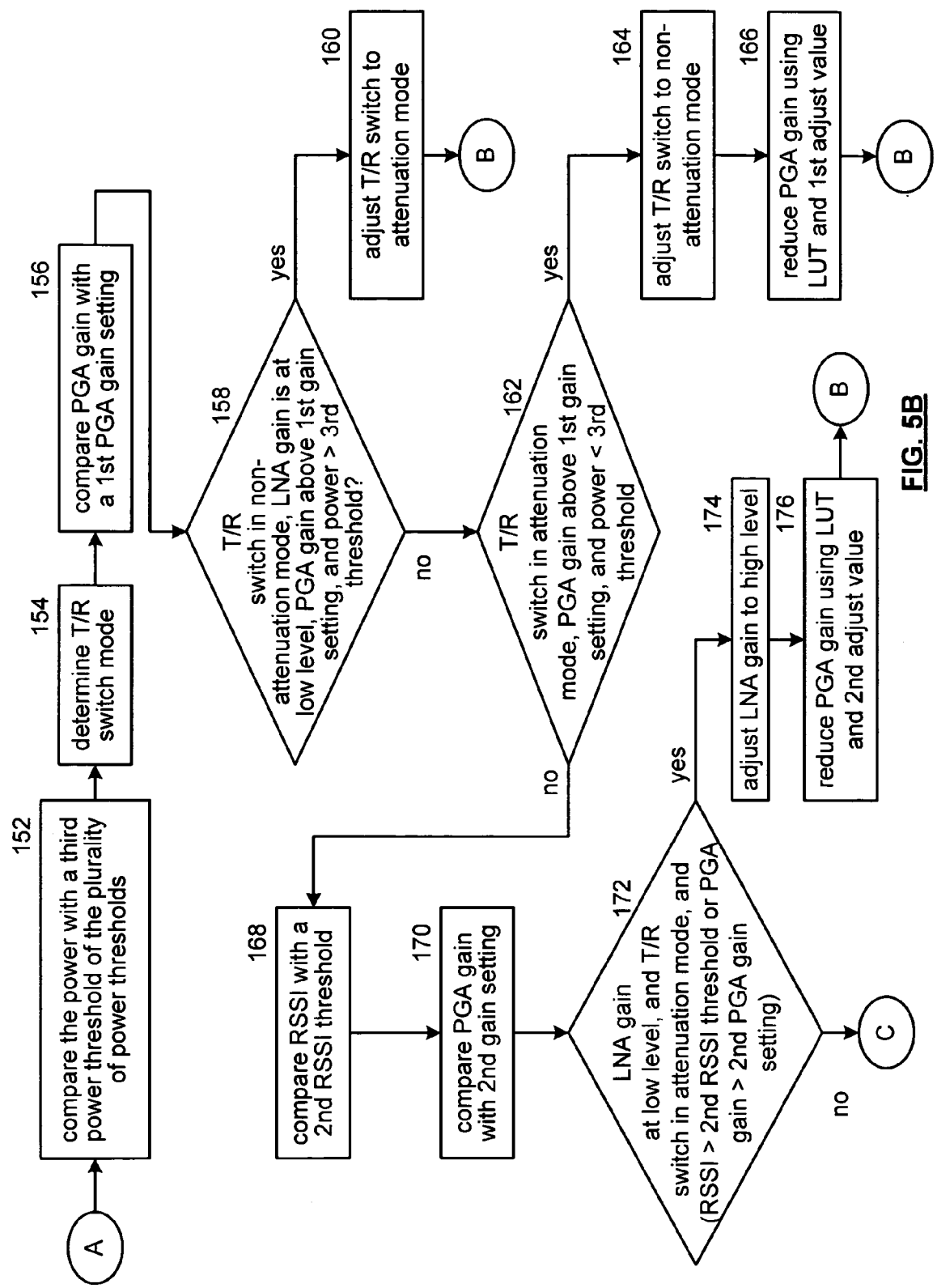
Figure 5C:
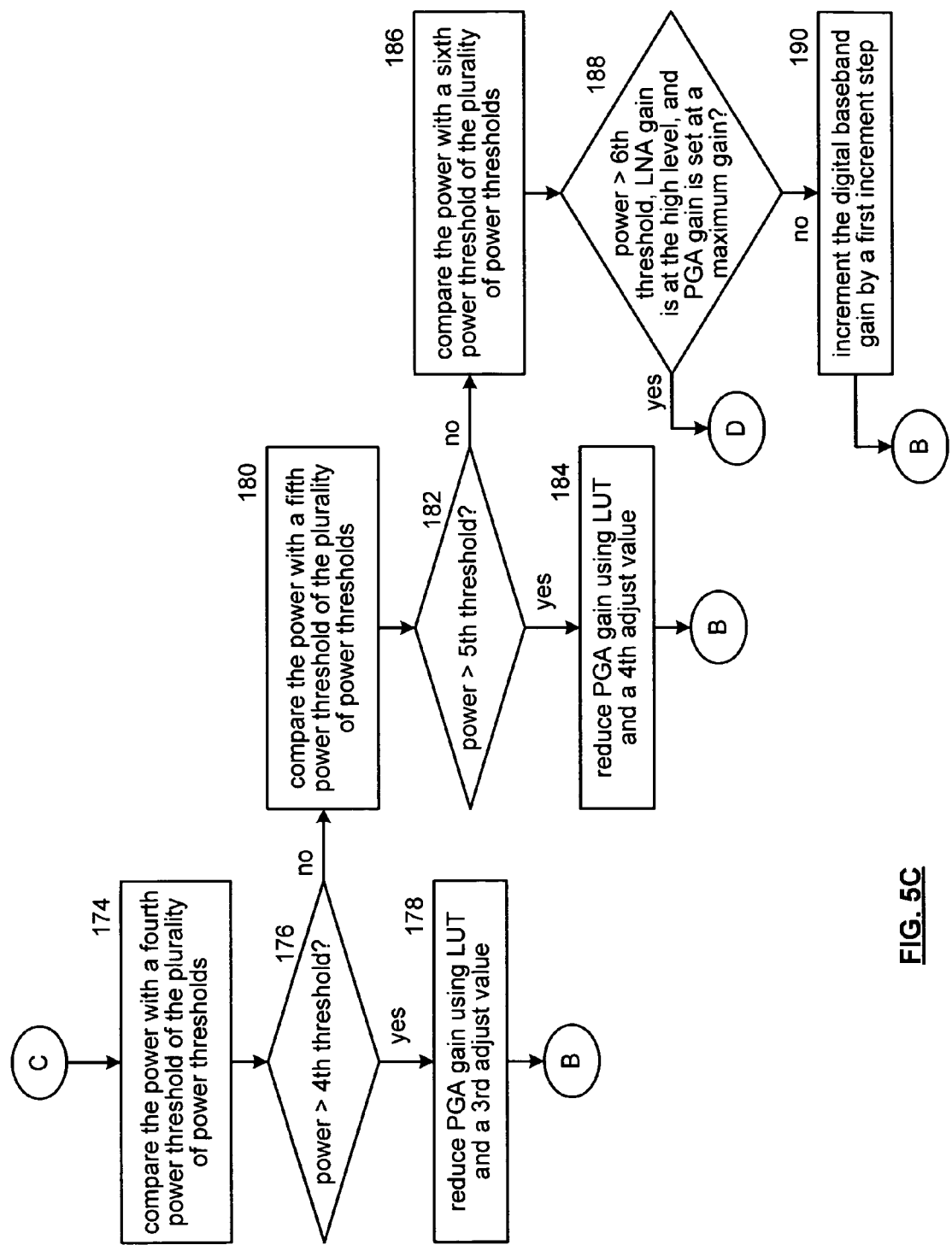

If, however, one of the cases of Step 172 is not true, the process proceeds to Step 174 as shown in FIG. 5C. At Step 174, the power of the received signal is compared with a 4th power threshold of the plurality of power thresholds, wherein the 3rd power threshold is greater than the 4th power threshold. As previously mentioned, the plurality of power thresholds may be set anywhere in the min to max power level range as shown in FIG. 3. The process then proceeds to Step 176 where a determination is made as to whether the power is greater than the 4th threshold. If so, the process proceeds to Step 178 where the PGA gain is reduced using the look-up table and a 3rd adjust value. Note that the 3rd adjust value is another step in which the PGA gain may be adjusted. At this point, the process reverts to Step 124 of FIG. 5A.

If the power is less than the 4th threshold, the process proceeds to Step 180 where the power is compared with a 5th power threshold of a plurality of power thresholds, wherein the 4th power threshold is greater than the 5th power threshold. Note that the power may be determined by measuring the RSSI and/or computed based on the square of the in-phase component plus the square of the quadrature component.

The process then proceeds to Step 182 where a determination is made as to whether the power is greater than the 5th threshold. If so, the process proceeds to Step 184 where the PGA gain is reduced using the look-up table and a 4th adjust value.

If, however, the power is less than the 5th threshold, the process proceeds to Step 186 where the power is compared with a 6th power threshold of the plurality of power thresholds, wherein the 5th power threshold is greater than the 6th power threshold. The process then proceeds to Step 188 where a determination is made as to whether the power is greater than the 6th threshold, the LNA gain is at the high level, and the PGA gain is set at a maximum gain. If not, the process proceeds to Step 190 where the digital baseband gain is incremented by a 1st incrementing step (e.g., 4 dB). Once the digital baseband gain has been incremented, the process reverts to Step 124.

Figure 5D:
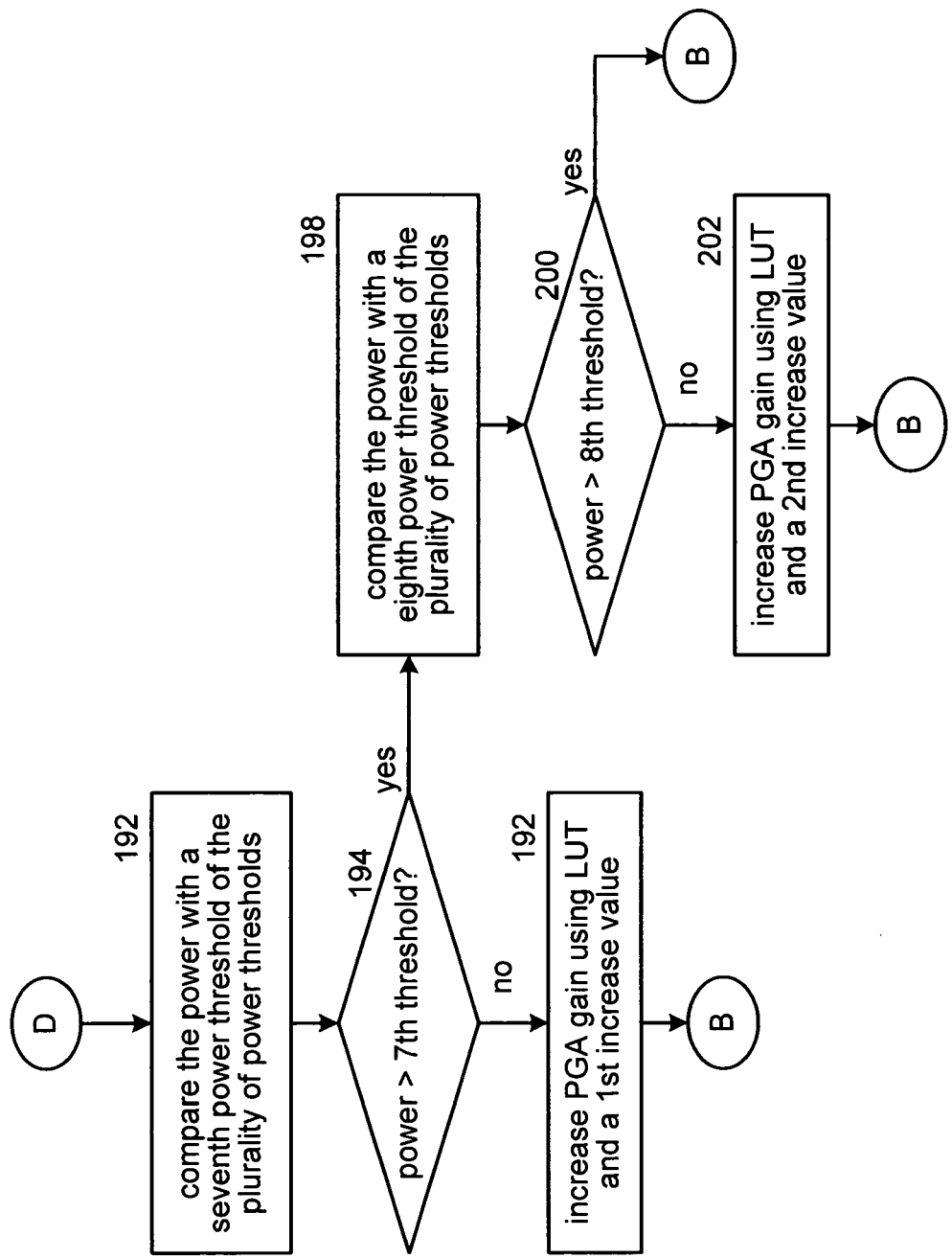

If, at Step 188 the result is true, the process proceeds to Step 192 of FIG. 5D. At Step 192, the power is compared with a 7th threshold of the plurality of thresholds. The process then proceeds to Step 194, where a determination is made as to whether the power is greater than the 7th threshold, wherein the 6th power threshold is greater than the 7th power threshold. If not, the process proceeds to Step 192 where the PGA gain is increased utilizing the look-up table and a 1st increase value. The PGA gain may be increased by determining a 1st PGA gain incrementing value based on at least one of the gain of the programmable gain amplifier, the power, the 6th power threshold, the mode of the T/R switch and the gain of the low noise amplifier. The increase in the gain may further include indexing a look-up table based on the 1st PGA gain increment level to determine the 1st gain incrementing value. The PGA gain is then adjusted based on the 1st PGA gain incrementing value. Once this is complete, the process reverts to Step 124 of FIG. 5A.

If, however, the power is greater than the 7th threshold, the process proceeds to Step 198 where the power is compared with an 8th power threshold of the plurality of power thresholds where the 8th power threshold is greater than the 7th power threshold. The process then proceeds to Step 200 where a determination is made as to whether the power threshold is greater than the 8th threshold. If so, the process reverts to Step 124 of FIG. 5A. If not, the process proceeds to Step 202 where the PGA gain is increased using the look-up table and a 2nd increase value. Once this Step is complete the process reverts to Step 124.

Figure 6:
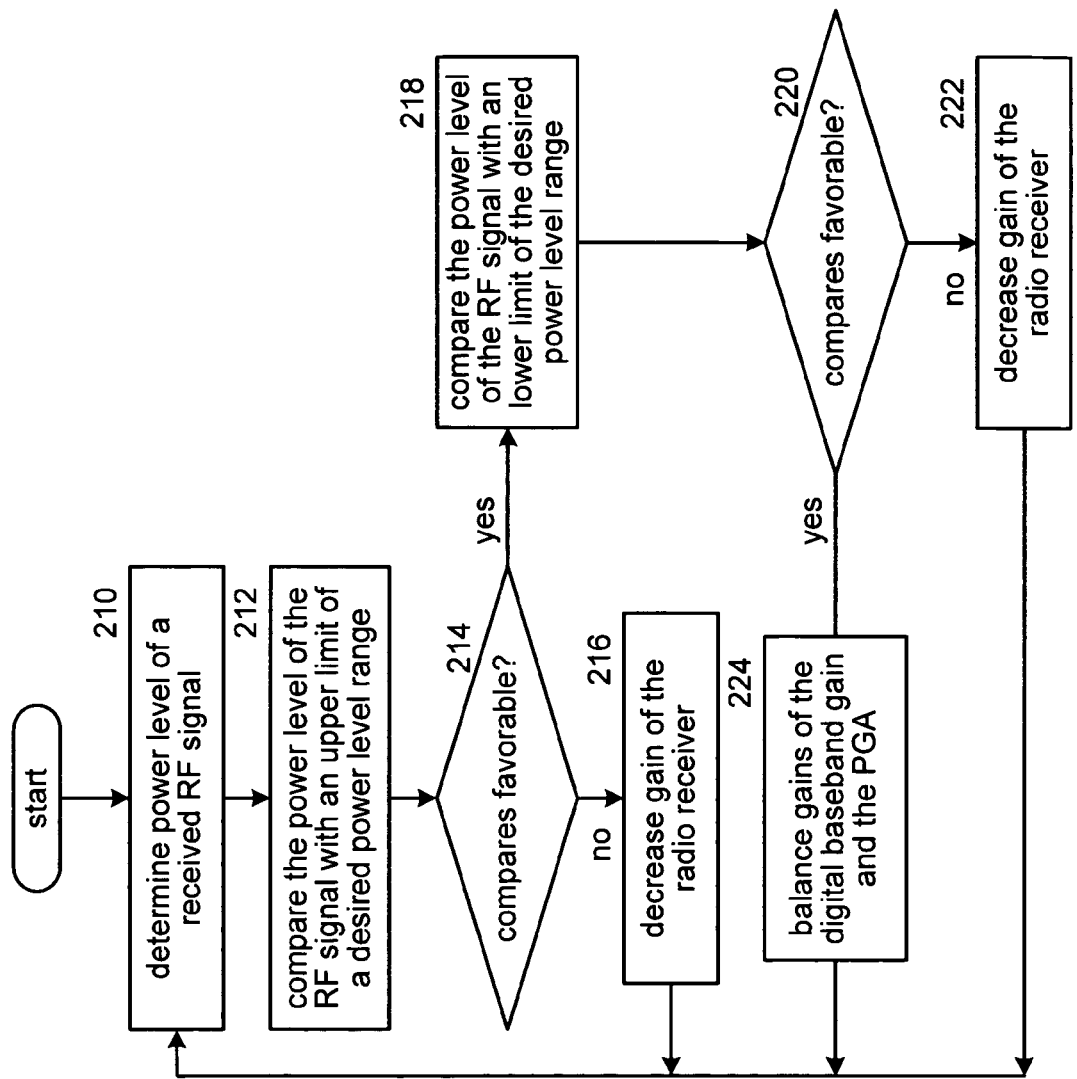
FIGS. 6, 7 and 8 are a logic diagram of another method for adjusting automatic gain control of a radio receiver in accordance with the present invention.

FIG. 6 is a logic diagram of another method for adjusting automatic gain control of a radio receiver. The process begins at Step 210 where a power level of a received RF signal is determined. This may be done by measuring the RSSI of the received RF signal or computing the power level by determining the square of an in-phase baseband component and summing it with the square of a quadrature baseband component for the in-phase and quadrature components where derived from the received RF signal. Further note that the received RF signal may be a test signal received during calibration of the radio receiver.

The process then proceeds to Step 212 where the power level of the RF signal is compared with an upper limit of a desired power level range. The process then proceeds to Step 214 where a determination is made as to whether the comparison was favorable. If so, the process proceeds to Step 218 where the power level of the RF signal is compared with a lower limit of a desired power level range. As an example, the upper and lower limits of the desired power level range are illustrated in FIG. 3A.

The process then proceeds to Step 220 where a determination is made as to whether the comparison of Step 218 was favorable. If not, the process proceeds to Step 222 where the gain of the radio receiver is increased. The gain of the radio receiver may be increased by switching the transmit/receive switch into a non-attenuation mode, increasing the low noise amplifier gain, increasing the programmable gain amplifier gain, and/or increasing the digital baseband gain. Once this is complete, the process repeats at Step 210. Note that the processing of this method may be done periodically, for example at 500 nanosecond increments.

If, at Step 214, the comparison of the power level with the upper limit was not favorable, the process proceeds to Step 216 where the gain of the radio receiver is decreased. This may be done by adjusting the T/R switch to the attenuation mode, by decreasing the gain of the LNA, PGA and/or digital baseband gain.

If, at Step 220 the comparison is favorable, indicating that the power level is between the upper and lower limits, the process proceeds to Step 224 where the gains of the digital baseband gain and the gain of the PGA are balanced to have the circuitry within the radio receiver operating at mid-range levels. Note that the upper and lower limits may be adjusted as the loop of FIG. 6 is repeated to further fine tune the gain settings of the radio receiver.

Figure 7:
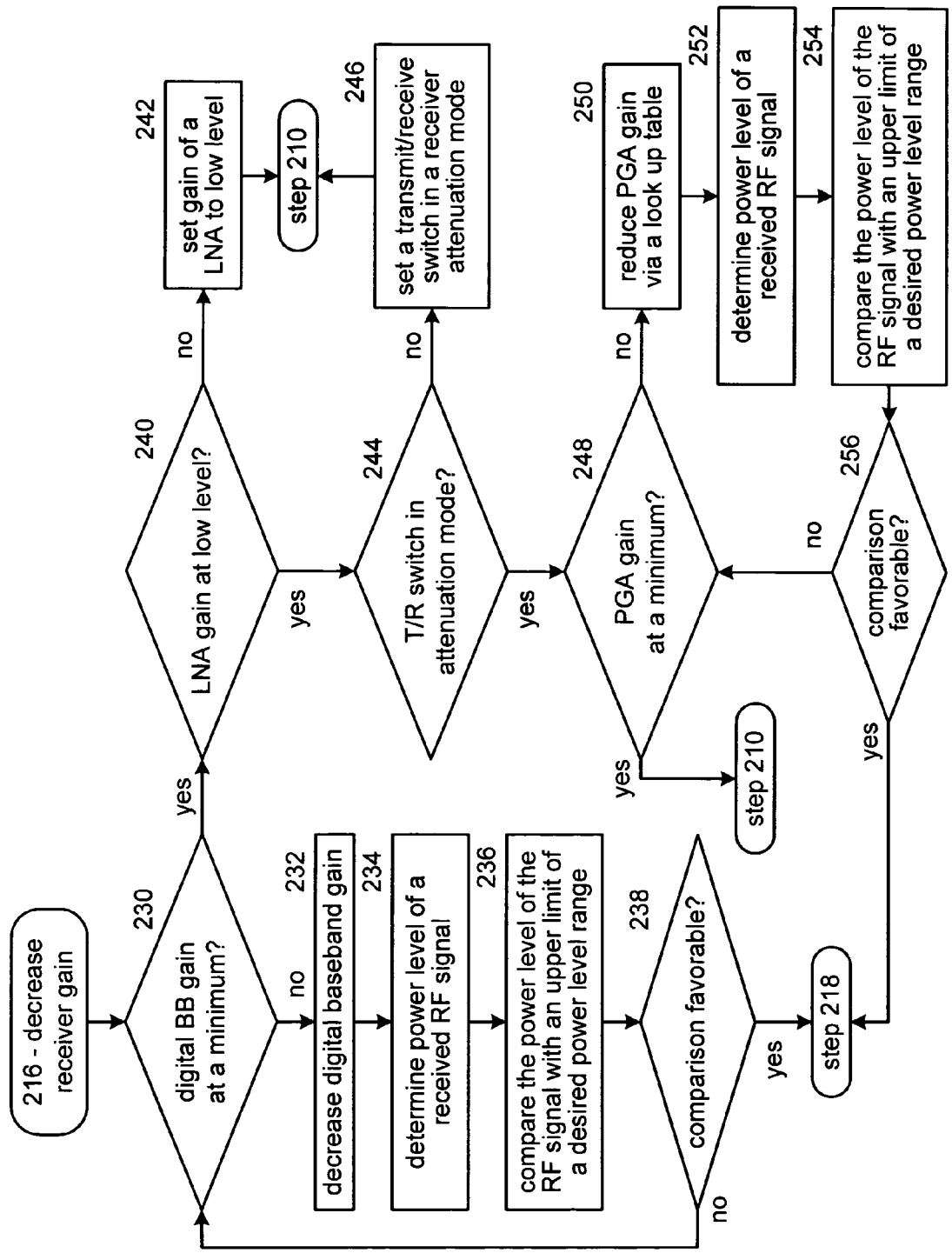

FIG. 7 illustrates a logic diagram of a method of how the receiver gain is decreased at Step 216. The processing begins at Step 230 where a determination is made as to whether the digital baseband gain is at a minimum. If so, the process proceeds to Step 240 where a determination is made as to whether the LNA gain is set at a low level. If so, the process proceeds to Step 244 where a determination is made as to whether the transmit/receive switch is in the attenuation mode. If so, the process proceeds to Step 248 where a determination is made as to whether the PGA gain is at a minimum. If so, the gain for the radio receiver is at a minimum and the gain cannot be decreased further such that the process reverts to Step 210 of the method of FIG. 6.

If, at Step 240, the LNA gain is not set at its lowest level, the process proceeds to Step 242 where the gain of the LNA is adjusted to the low level and the process reverts to Step 210. Similarly, if at Step 244 the T/R switch is not in the attenuation mode, the process proceeds to Step 246 where it is set into the attenuation mode.

If the PGA gain is not at the minimum, the process proceeds to Step 250 where the PGA gain is reduced via a look-up table. The process then proceeds to Step 252 where the power level of the received signal is determined. The process then proceeds to Step 254 where a comparison of the power level of the RF signal with an upper limit of the desired power level range is performed. The process then proceeds to Step 256 where a determination is made as to whether the comparison of Step 254 was favorable. If not, the process loops back to Step 248 to further adjust the PGA gain if the gain can be further reduced. If the comparison was favorable, the process continues at Step 218.

If, at Step 230 the digital baseband gain was not at a minimum, the process proceeds to Step 232 where the digital baseband gain is decreased. The process then proceeds to Step 234 where the power level of the receive signal is again determined with the reduced digital baseband gain. The process then proceeds to Step 236 where the power level of the received RF signal is compared with an upper limit of the desired power level threshold. At Step 238, a determination is made as to whether the comparison was favorable. If not, the process loops back to further reduce the digital baseband gain if it can be further reduced. If the comparison was favorable, the process reverts to Step 218.

Figure 8:
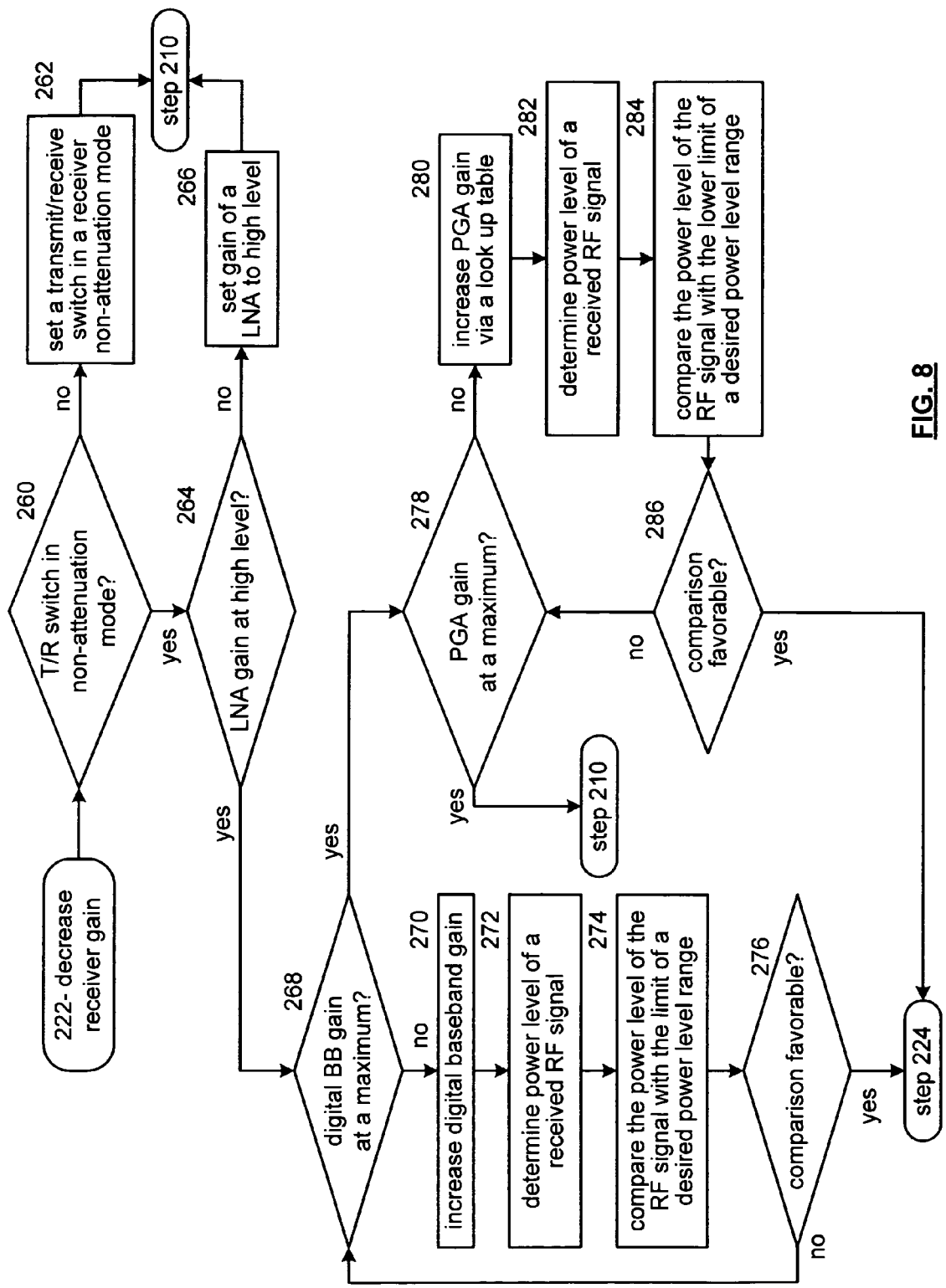

FIG. 8 is a logic diagram of a method for increasing the receiver gain as provided in Step 222 of FIG. 6. At Step 260, a determination is made as to whether the transmit/receive switch is in the non-attenuation mode. If not, the process proceeds to Step 262 where the transmit/receive switch is set to the non-attenuation mode. The process then reverts to Step 210 of FIG. 6. If the transmit/receive switch is in the non-attenuation mode, the process proceeds to Step 264 where a determination is made as to whether the low noise gain amplifier is at the high level. If not, the process proceeds to Step 266 where the LNA gain is set to the high level and the process reverts to Step 210.

If, however, the LNA gain is at the high level, the process proceeds to Step 268 where a determination is made as to whether the digital baseband gain is at a maximum level. If so, the process proceeds to Step 278 where a determination is made as to whether the PGA gain is at a maximum level. If so, the process reverts to Step 210 and the receiver is set at maximum gain.

If, however, the PGA gain is not at a maximum level, the process proceeds to Step 280 where the PGA gain is incremented via a look-up table. The process then proceeds to Step 282 where the power level is again measured with the increased PGA gain. The process then proceeds to Step 284 where the power level is compared with the lower limit of a desired power range. The process then proceeds to Step 286 where a determination is made as to whether the comparison was favorable if not, the process loops at Step 278. If the comparison was favorable, the process continues at Step 224 of FIG. 6.

If the digital baseband gain is not at a maximum, the process proceeds to Step 270 where the digital baseband gain is increased. The process then proceeds to Step 272 where the power of the received signal is determined again with the increased digital baseband gain. The process then proceeds to Step 274 where the power is compared with the limits of the desired power level range. If the comparison is favorable, the process continues at Step 224 of FIG. 6. If the comparison was not favorable, the process loops at Step 268.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented a method and apparatus for adjusting automatic gain control of a radio receiver. By utilizing a look-up table in the automatic gain control process, the speed at which the gain levels may be adjusted are significantly improved thereby meeting the most stringent requirements of current wireless local area network standards. As one of average skill in the art will appreciate, other embodiments may be derived from the teaching of the present invention without deviating from the scope of the claims.

What is claimed is:

1. A method for adjusting automatic gain control of a radio receiver, the method comprises:
   determining power level of a radio frequency (RF) signal received by the radio receiver to produce a determined power level;
   comparing the power level with a first power threshold of a plurality of power thresholds;
   when the power level exceeds the first power threshold:
      determining whether digital baseband gain of the radio receiver is at least a first decrement step level above a minimum gain;
      when the digital baseband gain is the at least the first decrement step level above the minimum gain, decrementing the digital baseband gain by the first decrement step level;
   when the power level does not exceed the first power threshold, comparing the power level with a second power threshold of the plurality of power thresholds, wherein the first power threshold is greater than the second power threshold;
   when the power level exceeds the second power threshold or the digital baseband gain is not the at least the first decrement step level above the minimum gain:
      determining whether the digital baseband gain of the radio receiver is at least a second decrement step level above the minimum gain, wherein the first decrement step level is greater than the second decrement step level;
      when the digital baseband gain is the at least the second decrement step level above the minimum gain, decrementing the digital baseband gain by the second decrement step level;
   when the power level does not exceed the second power threshold or the digital baseband gain is not the at least the second decrement step level above the minimum gain, comparing a received signal strength indication (RSSI) with a first RSSI threshold of the plurality of thresholds;
   when the RSSI exceeds the first RSSI threshold:
      determining whether gain of a low noise amplifier of the radio receiver is set a high level or a low level;
      when the gain of the low noise amplifier is set at the high level, adjusting the gain of the low noise amplifier to the low level.

2. The method of claim 1, wherein the determining the power level of the RF signal comprises at least one of:
   measuring RSSI of the RF signal; and
   calculating power of the RF signal based on a square of an in-phase baseband signal component and a square of a quadrature baseband signal component, wherein the radio receiver produces the in-phase and quadrature baseband signal components from the RF signal.

3. The method of claim 2 further comprises:
   when the RSSI does not exceeds the first RSSI threshold and the low noise amplifier gain is set at the low level:
      comparing the power with a third power threshold of the plurality of power thresholds, wherein the second power threshold is greater than the third power threshold;
      when the power exceeds the third power threshold, determining whether gain of a programmable gain amplifier (PGA) of the radio receiver is set above a first PGA gain setting;

when the gain of the programmable gain amplifier is set above the first PGA gain setting, determining whether a transmit/receive switch of the radio receiver is set in a receiver attenuation mode or a receiver non-attenuation mode; and when the transmit/receive switch is set to the receiver non-attenuation mode, adjusting the transmit/receive switch to the receiver attenuation mode.

4. The method of claim 3 further comprises:

when the power does not exceed the third power threshold, the gain of the programmable gain amplifier is set above the first PGA gain setting, and the transmit/receive switch is set in the receiver attenuation mode:
  adjusting the transmit/receive switch to the receiver non-attenuation mode; and
  reducing the gain of the programmable gain amplifier by:
    determining a first PGA gain decrement level based on at least one of: the gain of programmable gain amplifier, the power, the third power threshold, and the transmit/receiver switch in the receiver non-attenuation mode;
    indexing the look up table based on the first PGA gain decrement level to determine a first PGA gain adjust value; and
    adjusting the gain of the programmable gain amplifier based on the first PGA gain adjust value.

5. The method of claim 4 further comprises:

when the power exceeds the third power threshold, the gain of the programmable gain amplifier is not set above the first PGA gain setting, or the transmit/receive switch is set in the receiver non-attenuation mode:
  determining whether the gain of the low noise amplifier is at the low level;
  determining whether the transmit/receive switch is set in the receiver attenuation mode or the receiver non-attenuation mode;
  determining whether the RSSI is less than a second RSSI threshold of the plurality of power thresholds;
  determining whether gain of the programmable amplifier exceeds a second PGA gain setting, wherein the first PGA gain setting is greater than the second PGA gain setting;
  when the gain of the low noise amplifier is at the low level and the transmit/receive switch is in the receiver non-attenuation mode and (the RSSI does not exceed the second RSSI threshold or the gain of the programmable gain amplifier exceeds the second PGA gain setting):
    adjusting the gain of the low noise amplifier to the high level; and
    reducing the gain of the programmable gain amplifier by:
      determining a second PGA gain decrement level based on at least one of: the gain of programmable gain amplifier, the power, the third power threshold, and the gain of the low noise amplifier being at the high level;
      indexing the look up table based on the second PGA gain decrement level to determine a second PGA gain adjust value; and
      adjusting the gain of the programmable gain amplifier based on the second PGA gain adjust value.

6. The method of claim 5 further comprises:

when the gain of the low noise amplifier is at the high level or the transmit/receive switch is in the receiver attenuation mode or (the RSSI exceeds the second RSSI threshold or the gain of the programmable gain amplifier does not exceed the second PGA gain setting):
  comparing the power with a fourth power threshold of the plurality of power thresholds, wherein the third power threshold is greater than the fourth power threshold;
  when the power exceeds the fourth power level threshold, reducing the gain of the programmable gain amplifier by:
    determining a third PGA gain decrement level based on at least one of: the gain of programmable gain amplifier, the power, the fourth power threshold, the mode of the transmit/receive and the gain of the low noise amplifier;
    indexing the look up table based on the third PGA gain decrement level to determine a third PGA gain adjust value; and
    adjusting the gain of the programmable gain amplifier based on the third PGA gain adjust value;
  when the power does not exceed the fourth power level threshold, comparing the power with a fifth power threshold of the plurality of power thresholds, wherein the fourth power threshold is greater than the fifth power threshold;
  when the power exceeds the fifth power level threshold, reducing the gain of the programmable gain amplifier by:
    determining a fourth PGA gain decrement level based on at least one of: the gain of programmable gain amplifier, the power, the fifth power threshold, the mode of the transmit/receive and the gain of the low noise amplifier;
    indexing the look up table based on the fourth PGA gain decrement level to determine a fourth PGA gain adjust value; and
    adjusting the gain of the programmable gain amplifier based on the fourth PGA gain adjust value.

7. The method of claim 6 further comprises:

when the power does not exceed the fifth power level threshold, comparing the power with a sixth power threshold of the plurality of power thresholds, wherein the fifth power threshold is greater than the sixth power threshold;

when the power does not exceed the sixth power level threshold, the gain of the low noise amplifier is at the high level, and the gain of the programmable gain amplifier is set at a maximum gain, incrementing the digital baseband gain by a first increment step level;

when the power exceeds the sixth power level threshold, the gain of the low noise amplifier is at the low level, or the gain of the programmable gain amplifier is not set at the maximum gain, comparing the power with a seventh power threshold of the plurality of power thresholds, wherein the sixth power threshold is greater than the seventh power threshold;

when the power does not exceed the seventh power level, increasing the gain of the programmable gain amplifier by:
  determining a first PGA gain increment level based on at least one of: the gain of programmable gain amplifier, the power, the sixth power threshold, the mode of the transmit/receive and the gain of the low noise amplifier;
  indexing the look up table based on the first PGA gain increment level to determine a first PGA gain incrementing value; and adjusting the gain of the programmable gain amplifier based on the first PGA gain incrementing value;

when the power exceeds the seventh power level threshold, comparing the power with an eighth power threshold of the plurality of power thresholds, wherein the eighth power threshold is greater than the seventh power threshold;

when the power does not exceed the eighth power level threshold, increasing the gain of the programmable gain amplifier by:

determining a second PGA gain increment level based on at least one of: the gain of programmable gain amplifier, the power, the sixth power threshold, the mode of the transmit/receive and the gain of the low noise amplifier;

indexing the look up table based on the second PGA gain increment level to determine a second PGA gain incrementing value; and adjusting the gain of the programmable gain amplifier based on the second PGA gain incrementing value.

8. A method for adjusting automatic gain control of a radio receiver, the method comprises:

determining power level of a radio frequency (RF) signal received by the radio receiver to produce a determined power level;

comparing the power level of the RF signal with an upper limit of a desired power level range;

when the power level of the RF signal compares unfavorably with the upper limit of the desired power level range, decreasing gain of the radio receiver by:

decreasing digital baseband gain of the radio receiver until the power level of the RF signal compares favorably with the upper limit of the desired power level or the digital baseband gain reaches a minimum setting;

when the digital baseband gain reaches the minimum setting, setting gain of a low noise amplifier of the radio receiver to a low level;

when the power level of the RF signal compares unfavorably with the upper limit of the desired power level range with the gain of the low noise amplifier set at the low level and the digital baseband gain at the minimum setting, setting a transmit/receive switch in a receiver attenuation mode;

when the power level of the RF signal compares unfavorably with the upper limit of the desired power level range with the gain of the low noise amplifier set at the low level, the digital baseband gain at the minimum setting and the transmit/receiver switch in the receiver attenuation mode, reducing gain of a programmable gain amplifier of the radio receiver, via a look up table, until the power level of the RF signal compares favorably with the upper limit of the desired power level or the gain of the programmable gain amplifier reaches a minimum PGA setting;

when the power level of the RF signal compares favorably with the upper limit of the desired power level range, comparing the power level of the RF signal with a lower limit of the desired power level range;

when the power level of the RF signal compares unfavorably with the lower limit of the desired power level range, increasing gain of the radio receiver by:

setting the transmit/receive switch in a receiver non-attenuation mode;

when the power level of the RF signal compares unfavorably with the lower limit of the desired power level range with the transmit/receive switch in the receiver non-attenuation mode, setting the gain of the low noise amplifier to a high level;

when the power level of the RF signal compares unfavorably with the lower limit of the desired power level range with the transmit/receive switch in the receiver non-attenuation mode and the gain of the low noise amplifier at the high level, incrementing the digital baseband gain until the power level of the RF signal compares favorably with the lower limit of the desired power level or the digital baseband gain reaches a maximum setting;

when the power level of the RF signal compares unfavorably with the lower limit of the desired power level range with the transmit/receive switch in the receiver non-attenuation mode, the gain of the low noise amplifier at the high level, and the digital baseband gain set at the maximum setting, increasing the gain of the programmable gain amplifier, via the look up table, until the power level of the RF signal compares favorably with the lower limit of the desired power level or the gain of the programmable gain amplifier reaches a maximum PGA setting; and when the power level of the RF signal compares favorably to the upper limit and the lower limit of the desired power level range, balancing gains of the digital baseband gain and the programmable gain amplifier.

9. The method of claim 8, wherein the reducing the gain of a programmable gain amplifier of the radio receiver via the look up table comprises:

determining a PGA gain decrement level based on at least one of: the gain of programmable gain amplifier, the power level of the RF signal, the mode of the transmit/receive switch, and the gain of the low noise amplifier;

indexing the look up table based on the PGA gain decrement level to determine a PGA gain adjust value; and adjusting the gain of the programmable gain amplifier based on the PGA gain adjust value.

10. The method of claim 8, wherein the increasing the gain of a programmable gain amplifier of the radio receiver via the look up table comprises:

determining a PGA gain increment level based on at least one of: the gain of programmable gain amplifier, the power level of the RF signal, the mode of the transmit/receive switch, and the gain of the low noise amplifier;

indexing the look up table based on the PGA gain increment level to determine a PGA gain adjust value; and adjusting the gain of the programmable gain amplifier based on the PGA gain adjust value.

11. A radio frequency integrated circuit (RFIC) comprises:

a transmitter section operably coupled to convert outbound baseband signals into outbound radio frequency (RF) signals;

a receiver section operably coupled to convert inbound RF signals into inbound baseband signals;

a transmit/receiver switch operably coupled to an antenna to provide the inbound RE signals from the antenna to the receiver section and to provide the outbound RF signals from the transmitter section to the antenna, wherein the receiver section includes:

a low noise amplifier operably coupled to amplify the inbound RF signals to produce amplified inbound RF signals;

programmable gain amplifier operably coupled to amplify the amplified inbound RF signals to produce PGA amplified RF signals;

down conversion module operably coupled to convert the PGA amplified RF signals into in-phase baseband signal components and quadrature baseband signal components;

digital to analog conversion module operably coupled to convert the in-phase baseband signal components into digital in-phase baseband signal components and to convert the quadrature baseband signal components into digital quadrature baseband signal components; and digital baseband gain module operably coupled to amplify the digital in-phase and quadrature baseband signal components to produce amplified digital in-phase and quadrature baseband signal components; and automatic gain control module operably coupled to:
determine power level of the inbound RF signals to produce a determined power level;
comparing the determined power level with a plurality of power thresholds to determine whether an automatic gain adjustment is needed;
when the automatic gain adjustment is needed:
determining, from the comparing the determined power level with the plurality of power thresholds, a sign of the automatic gain adjustment;
determining, from the comparing the determined power level with the plurality of power thresholds, a magnitude of the automatic gain adjustment;
addressing a gain adjustment look up table for at least a portion of the radio receiver based on the magnitude to produce a gain setting; and
adjusting gain of at least one of the transmit/receive switch, the low noise amplifier, the programmable gain amplifier, and the digital baseband gain module based on the sign of the automatic gain adjustment and the gain setting.

12. The RFIC of claim 11, wherein the determining the power level of the inbound RF signals comprises at least one of:
measuring a received signal strength indication (RSSI) of the inbound RF signals; and
calculating power of the inbound RF signals based on a square of an in-phase baseband signal component and a square of a quadrature baseband signal component, wherein the radio receiver produces the in-phase and quadrature baseband signal components from the RF signal.

13. The RFIC of claim 12, wherein the automatic gain control module is further operably coupled to:
comparing the power with a first power threshold of the plurality of power thresholds;
when the power exceeds the first power threshold:
determining whether gain of the digital baseband gain module is at least a first decrement step level above a minimum gain;
when the gain of the digital baseband gain module is the at least the first decrement step level above the minimum gain, decrementing the gain of the digital baseband gain module by the first decrement step level;
when the power does not exceed the first power threshold, comparing the power with a second power threshold of the plurality of power thresholds, wherein the first power threshold is greater than the second power threshold;

when the power exceeds the second power threshold or the gain of the digital baseband gain module is not the at least the first decrement step level above the minimum gain:
determining whether the gain of the digital baseband gain module is at least a second decrement step level above the minimum gain, wherein the first decrement step level is greater than the second decrement step level;
when the gain of the digital baseband gain module is the at least the second decrement step level above the minimum gain, decrementing the gain of the digital baseband gain module by the second decrement step level;
when the power does not exceed the second power threshold or the gain of the digital baseband gain module is not the at least the second decrement step level above the minimum gain, comparing the RSSI with a first RSSI threshold of the plurality of thresholds;
when the RSSI exceeds the first RSSI threshold:
determining whether gain of the low noise amplifier is set a high level or a low level;
when the gain of the low noise amplifier is set at the high level, adjusting the gain of the low noise amplifier to the low level.

14. The RFIC of claim 13, wherein the automatic gain control module is further operably coupled to:
when the RSSI does not exceeds the first RSSI threshold and the low noise amplifier gain is set at the low level:
comparing the power with a third power threshold of the plurality of power thresholds, wherein the second power threshold is greater than the third power threshold;
when the power exceeds the third power threshold, determining whether gain of the programmable gain amplifier is set above a first PGA gain setting;
when the gain of the programmable gain amplifier is set above the first PGA gain setting, determining whether the transmit/receive switch of the radio receiver is set in a receiver attenuation mode or a receiver non-attenuation mode; and
when the transmit/receive switch is set to the receiver non-attenuation mode, adjusting the transmit/receive switch to the receiver attenuation mode.

15. The RFIC of claim 14, wherein the automatic gain control module is further operably coupled to:
when the power does not exceed the third power threshold, the gain of the programmable gain amplifier is set above the first PGA gain setting, and the transmit/receive switch is set in the receiver attenuation mode:
adjusting the transmit/receive switch to the receiver non-attenuation mode; and
reducing the gain of the programmable gain amplifier by:
determining a first PGA gain decrement level based on at least one of: the gain of programmable gain amplifier, the power, the third power threshold, and the transmit/receiver switch in the receiver non-attenuation mode;
indexing the look up table based on the first PGA gain decrement level to determine a first PGA gain adjust value; and
adjusting the gain of the programmable gain amplifier based on the first PGA gain adjust value.

16. The RFIC of claim 15, wherein the automatic gain control module is further operably coupled to:
  when the power exceeds the third power threshold, the gain of the programmable gain amplifier is not set above the first PGA gain setting, or the transmit/receive switch is set in the receiver non-attenuation mode:
    determining whether the gain of the low noise amplifier is at the low level;
    determining whether the transmit/receive switch is set in the receiver attenuation mode or the receiver non-attenuation mode;
    determining whether the RSSI is less than a second RSSI threshold of the plurality of power thresholds;
    determining whether gain of the programmable amplifier exceeds a second PGA gain setting, wherein the first PGA gain setting is greater than the second PGA gain setting;
  when the gain of the low noise amplifier is at the low level and the transmit/receive switch is in the receiver non-attenuation mode and (the RSSI does not exceed the second RSSI threshold or the gain of the programmable gain amplifier exceeds the second PGA gain setting):
    adjusting the gain of the low noise amplifier to the high level; and
    reducing the gain of the programmable gain amplifier by:
      determining a second PGA gain decrement level based on at least one of: the gain of programmable gain amplifier, the power, the third power threshold, and the gain of the low noise amplifier being at the high level;
      indexing the look up table based on the second PGA gain decrement level to determine a second PGA gain adjust value; and
      adjusting the gain of the programmable gain amplifier based on the second PGA gain adjust value.

17. The RFIC of claim 16, wherein the automatic gain control module is further operably coupled to:
  when the gain of the low noise amplifier is at the high level or the transmit/receive switch is in the receiver attenuation mode or (the RSSI exceeds the second RSSI threshold or the gain of the programmable gain amplifier does not exceed the second PGA gain setting):
    comparing the power with a fourth power threshold of the plurality of power thresholds, wherein the third power threshold is greater than the fourth power threshold;
    when the power exceeds the fourth power level threshold, reducing the gain of the programmable gain amplifier by:
      determining a third PGA gain decrement level based on at least one of: the gain of programmable gain amplifier, the power, the fourth power threshold, the mode of the transmit/receive and the gain of the low noise amplifier;
      indexing the look up table based on the third PGA gain decrement level to determine a third PGA gain adjust value; and
      adjusting the gain of the programmable gain amplifier based on the third PGA gain adjust value;
    when the power does not exceed the fourth power level threshold, comparing the power with a fifth power threshold of the plurality of power thresholds, wherein the fourth power threshold is greater than the fifth power threshold;
    when the power exceeds the fifth power level threshold, reducing the gain of the programmable gain amplifier by:
      determining a fourth PGA gain decrement level based on at least one of: the gain of programmable gain amplifier, the power, the fifth power threshold, the mode of the transmit/receive and the gain of the low noise amplifier;
      indexing the look up table based on the fourth PGA gain decrement level to determine a fourth PGA gain adjust value; and
      adjusting the gain of the programmable gain amplifier based on the fourth PGA gain adjust value.

18. The RFIC of claim 17, wherein the automatic gain control module is further operably coupled to:
  when the power does not exceed the fifth power level threshold, comparing the power with a sixth power threshold of the plurality of power thresholds, wherein the fifth power threshold is greater than the sixth power threshold;
  when the power does not exceed the sixth power level threshold, the gain of the low noise amplifier is at the high level, and the gain of the programmable gain amplifier is set at a maximum gain, incrementing the digital baseband gain by a first increment step level;
  when the power exceeds the sixth power level threshold, the gain of the low noise amplifier is at the low level, or the gain of the programmable gain amplifier is not set at the maximum gain, comparing the power with a seventh power threshold of the plurality of power thresholds, wherein the sixth power threshold is greater than the seventh power threshold;
  when the power does not exceed the seventh power level, increasing the gain of the programmable gain amplifier by:
    determining a first PGA gain increment level based on at least one of: the gain of programmable gain amplifier, the power, the sixth power threshold, the mode of the transmit/receive and the gain of the low noise amplifier;
    indexing the look up table based on the first PGA gain increment level to determine a first PGA gain incrementing value; and
    adjusting the gain of the programmable gain amplifier based on the first PGA gain incrementing value;
  when the power exceeds the seventh power level threshold, comparing the power with an eighth power threshold of the plurality of power thresholds, wherein the eighth power threshold is greater than the seventh power threshold;
  when the power exceeds the eighth power level threshold, increasing the gain of the programmable gain amplifier by:
    determining a second PGA gain increment level based on at least one of: the gain of programmable gain amplifier, the power, the sixth power threshold, the mode of the transmit/receive and the gain of the low noise amplifier;
    indexing the look up table based on the second PGA gain increment level to determine a second PGA gain incrementing value; and
    adjusting the gain of the programmable gain amplifier based on the second PGA gain incrementing value.

19. A radio frequency integrated circuit (RFIC) comprises:
- a transmitter section operably coupled to convert outbound baseband signals into outbound radio frequency (RF) signals;
- a receiver section operably coupled to convert inbound RF signals into inbound baseband signals;
- a transmit/receiver switch operably coupled to an antenna to provide the inbound RF signals from the antenna to the receiver section and to provide the outbound RF signals from the transmitter section to the antenna, wherein the receiver section includes:
  - a low noise amplifier operably coupled to amplify the inbound RF signals to produce amplified inbound RF signals;
  - programmable gain amplifier operably coupled to amplify the amplified inbound RF signals to produce PGA amplified RF signals;
  - down conversion module operably coupled to convert the PGA amplified RF signals into in-phase baseband signal components and quadrature baseband signal components;
  - digital to analog conversion module operably coupled to convert the in-phase baseband signal components into digital in-phase baseband signal components and to convert the quadrature baseband signal components into digital quadrature baseband signal components; and
  - digital baseband gain module operably coupled to amplify the digital in-phase and quadrature baseband signal components to produce amplified digital in-phase and quadrature baseband signal components; and
- automatic gain control module operably coupled to:
  - determine power level of the inbound RF signals to produce a determined power level;
  - compare the power level of the inbound RF signals with an upper limit of a desired power level range;
  - when the power level of the inbound RF signals compares unfavorably with the upper limit of the desired power level range, decreasing gain of the receiver section by:
    - decreasing gain of the digital baseband gain module until the power level of the RF signal compares favorably with the upper limit of the desired power level or the gain of the digital baseband gain module reaches a minimum setting;
    - when the gain of the digital baseband gain module reaches the minimum setting, setting gain of the low noise amplifier to a low level;
    - when the power level of the inbound RF signals compares unfavorably with the upper limit of the desired power level range with the gain of the low noise amplifier set at the low level and the gain of the digital baseband gain module at the minimum setting, setting the transmit/receive switch in a receiver attenuation mode;
    - when the power level of the inbound RF signals compares unfavorably with the upper limit of the desired power level range with the gain of the low noise amplifier set at the low level, the gain of the digital baseband gain module at the minimum setting and the transmit/receiver switch in the receiver attenuation mode, reducing gain of the programmable gain amplifier, via a look up table, until the power level of the inbound RF signals compares favorably with the upper limit of the desired power level or the gain of the programmable gain amplifier reaches a minimum PGA setting;
  - when the power level of the inbound RF signals compares favorably with the upper limit of the desired power level range, comparing the power level of the inbound RF signals with a lower limit of the desired power level range;
  - when the power level of the inbound RF signals compares unfavorably with the lower limit of the desired power level range, increasing gain of the radio receiver by:
    - setting the transmit/receive switch in a receiver non-attenuation mode;
    - when the power level of the inbound RF signals compares unfavorably with the lower limit of the desired power level range with the transmit/receive switch in the receiver non-attenuation mode, setting the gain of the low noise amplifier to a high level;
    - when the power level of the inbound RF signals compares unfavorably with the lower limit of the desired power level range with the transmit/receive switch in the receiver non-attenuation mode and the gain of the low noise amplifier at the high level, incrementing the gain of the digital baseband gain module until the power level of the inbound RF signals compares favorably with the lower limit of the desired power level or the gain of the digital baseband gain module reaches a maximum setting;
    - when the power level of the inbound RF signals compares unfavorably with the lower limit of the desired power level range with the transmit/receive switch in the receiver non-attenuation mode, the gain of the low noise amplifier at the high level, and the digital baseband gain set at the maximum setting, increasing the gain of the programmable gain amplifier, via the look up table, until the power level of the inbound RF signals compares favorably with the lower limit of the desired power level or the gain of the programmable gain amplifier reaches a maximum PGA setting; and
  - when the power level of the inbound RF signals compares favorably to the upper limit and the lower limit of the desired power level range, balancing gains of the digital baseband gain module and the programmable gain amplifier.

20. The RFIC of claim 19, wherein the reducing the gain of a programmable gain amplifier of the radio receiver via the look up table comprises:
- determining a PGA gain decrement level based on at least one of: the gain of programmable gain amplifier, the power level of the inbound RF signals, the mode of the transmit/receive switch, and the gain of the low noise amplifier;
- indexing the look up table based on the PGA gain decrement level to determine a PGA gain adjust value; and
- adjusting the gain of the programmable gain amplifier based on the PGA gain adjust value.

21. The RFIC of claim 19, wherein the increasing the gain of a programmable gain amplifier of the radio receiver via the look up table comprises:

determining a PGA gain increment level based on at least one of: the gain of programmable gain amplifier, the power level of the inbound RF signals, the mode of the transmit/receive switch, and the gain of the low noise amplifier;

indexing the look up table based on the PGA gain increment level to determine a PGA gain adjust value; and adjusting the gain of the programmable gain amplifier based on the PGA gain adjust value.

* * * * *